US009158671B2

(12) United States Patent
Ryu et al.

(10) Patent No.: US 9,158,671 B2
(45) Date of Patent: Oct. 13, 2015

(54) NONVOLATILE MEMORY SYSTEM WITH MIGRATION MANAGER

(75) Inventors: Jun Kil Ryu, Seongnam-si (KR); MoonSang Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 209 days.

(21) Appl. No.: 13/586,967

(22) Filed: Aug. 16, 2012

(65) Prior Publication Data
US 2013/0046920 A1 Feb. 21, 2013

(30) Foreign Application Priority Data

Aug. 17, 2011 (KR) ........................ 10-2011-0081591

(51) Int. Cl.
*G06F 12/00* (2006.01)
*G06F 12/02* (2006.01)
*G06F 3/06* (2006.01)
*G06F 12/08* (2006.01)

(52) U.S. Cl.
CPC .......... *G06F 12/0246* (2013.01); *G06F 3/0604* (2013.01); *G06F 3/068* (2013.01); *G06F 3/0649* (2013.01); *G06F 12/0868* (2013.01); *G06F 2212/2022* (2013.01); *G06F 2212/313* (2013.01); *G06F 2212/7203* (2013.01); *G11C 2211/5641* (2013.01)

(58) Field of Classification Search
USPC .......................................................... 711/118
See application file for complete search history.

(56) References Cited

U.S. PATENT DOCUMENTS

| 7,453,712 | B2 | 11/2008 | Kim et al. |
| 7,899,987 | B2 | 3/2011 | Salomon et al. |
| 7,961,511 | B2 | 6/2011 | Lee et al. |
| 2009/0037648 | A1 | 2/2009 | Park et al. |
| 2009/0043831 | A1 | 2/2009 | Antonopoulos et al. |
| 2009/0265506 | A1 | 10/2009 | Yim |
| 2009/0300269 | A1 | 12/2009 | Radke et al. |
| 2009/0327591 | A1 | 12/2009 | Moshayedi |
| 2010/0088459 | A1 | 4/2010 | Arya et al. |
| 2010/0161933 | A1 | 6/2010 | Moon et al. |

FOREIGN PATENT DOCUMENTS

| KR | 1020090109959 A | 10/2009 |
| KR | 1020100062562 A | 6/2010 |

OTHER PUBLICATIONS

Soojun Im et al., "Storage Architecture and Software Support Storage Architecture and Software Support for SLC/MLC Combined Flash memory" p. 1664-1669.
Park, Kwanghee et al., "An Efficient Data Block Replacement and Rearrangement Technique for Hybrid Hard Disk Drive", 2009.

*Primary Examiner* — Matthew Bradley
(74) *Attorney, Agent, or Firm* — Volentine & Whitt, PLLC

(57) ABSTRACT

Disclosed is a memory system that includes a nonvolatile memory having a main region and a cache region; and a memory controller having migration manager managing a migration operation that moves data from cache region to the main region by referencing a Most Recently Used/Least Recently Used (MRU/LRU) list.

22 Claims, 18 Drawing Sheets

NONVOLATILE MEMORY SYSTEM WITH MIGRATION MANAGER

CROSS-REFERENCE TO RELATED APPLICATIONS

This application claims the benefits under 35 U.S.C §119 of Korean Patent Application No. 10-2011-0081591 filed Aug. 17, 2011, the subject matter of which is hereby incorporated by reference.

BACKGROUND

The inventive concept relates to semiconductor memory devices, and more particularly, to nonvolatile memory-based memory systems capable of performing a migration operation.

Semiconductor memory devices may be classified as volatile memory devices, such as the DRAM, SRAM, etc., and nonvolatile memory devices, such as the EEPROM, FRAM, PRAM, MRAM, flash memory, etc. Volatile memory devices loses stored data in the absence of applied power, while nonvolatile memory devices retain stored data even in the absence of applied power. Within the broader class of nonvolatile memory devices, flash memory provides certain merits such as a rapid read speed, low power consumption, a mass storage capacity, etc. Thus, memory systems including flash memory have been widely used as a data storage medium in contemporary digital computational platforms and consumer electronics.

Memory systems including flash memory may use a log block or a cache block to manage file data efficiently and improve memory system performance. That is, memory systems may reduce the number of required merge operations and/or block erase operations by storing file data in a cache region before the file data is stored in a main region.

However, as the size of file data increases the demands placed on the cache region increase. In many instances, available space in the cache region becomes a serious memory system resource constraint, and in such circumstances, file data must be frequently exchanged between the cache region and main region, thus lowering the overall performance of the memory system.

SUMMARY

In one embodiment, the inventive concept provides a memory system comprising; a nonvolatile memory including a main region and a cache region, and a memory controller. The memory controller is configured to control operation of the nonvolatile memory and including a migration manager that manages file data migration from the cache region to the main region with reference to a Most Recently Used (MRU)/Least Recently Used (LRU) list containing entries for file data units stored in the cache region, wherein the migration manager defines the MRU/LRU list as an arrangement of highest to lowest queue locations, such that entries related to more recently written file data units are arranged higher in queue location than entries related to more recently read file data units, and entries related to more recently read file data units are arranged higher in queue location than entries related to less recently written file data units.

In another embodiment, the inventive concept provides a memory system comprising; a flash memory having a main region configured from multi-level memory cells (MLC) and a cache region configured from single-level memory cells (SLC), and a memory controller configured to control operation of the flash memory and including a migration manager that manages file data migration from the cache region to the main region with reference to a Most Recently Used (MRU)/Least Recently Used (LRU) list containing entries for file data units stored in the cache region, wherein the memory controller temporarily uses some of the MLC as part of the cache region if an insufficient number of the SLC are available when a file data unit is stored in the cache region.

BRIEF DESCRIPTION OF THE FIGURES

The above and other objects and features will become apparent from the following description with reference to the following figures

DETAILED DESCRIPTION

Figure 1:
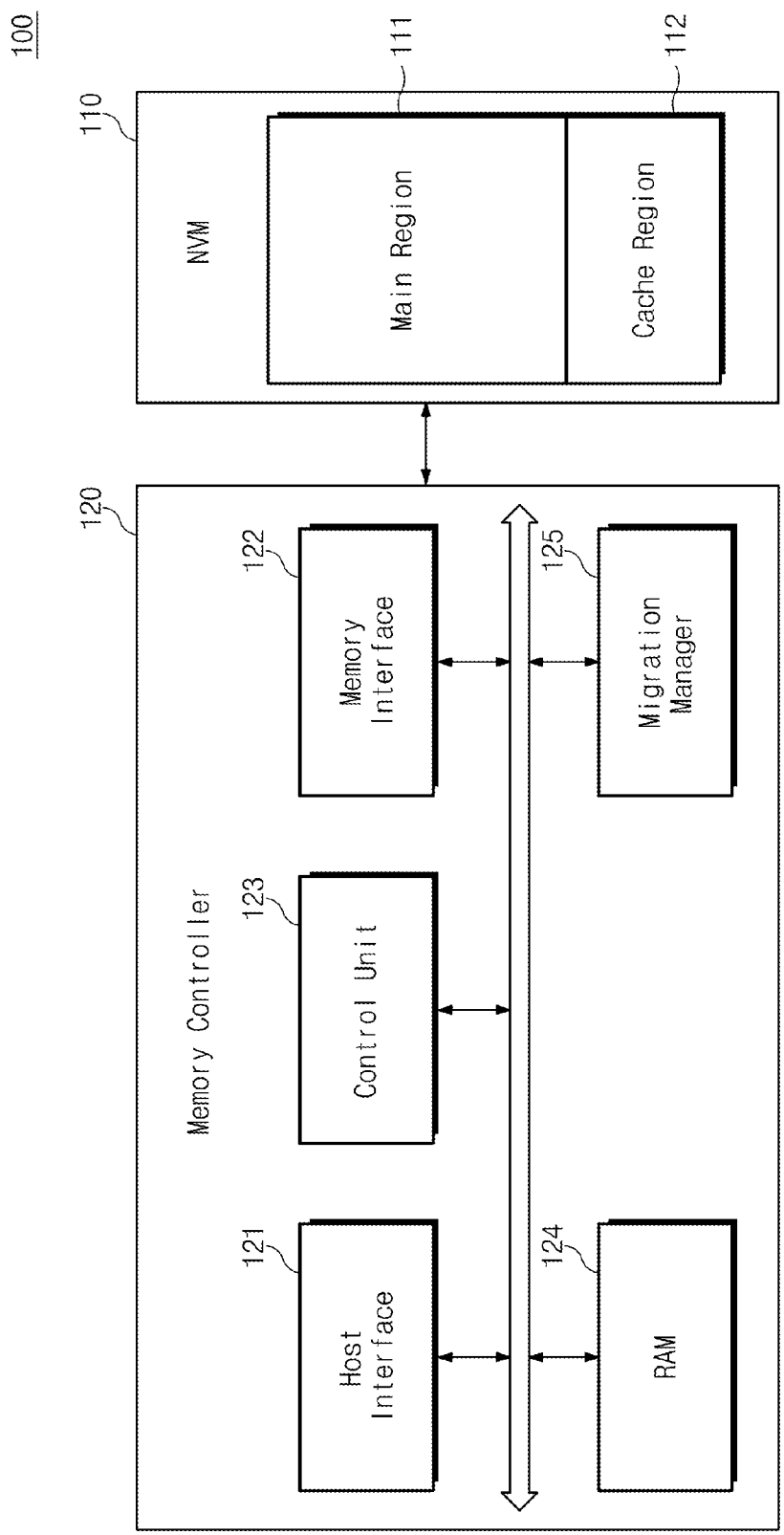
FIG. 1 is a block diagram illustrating a memory system according to an embodiment of the inventive concept.

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements and features.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a memory system according to an embodiment of the inventive concept. Referring to FIG. 1, a memory system 100 generally comprises a nonvolatile memory device (NVM) 110 and a memory controller 120.

The memory controller 120 controls the overall operation of the nonvolatile memory device 110 and particularly controls the execution of certain operations (e.g., program or write operation, read operation, erase operation, etc.). In the illustrate embodiment of FIG. 1, the nonvolatile memory device 110 includes a main region 111 and a cache region 112. The main region 111 will typically be formed of memory cells and related circuitry that operate at relatively low speed (hereinafter, "low-speed nonvolatile memory") while the cache region 112 will typically be formed of memory cells and related circuitry operating at relatively high speed (hereinafter, "high-speed nonvolatile memory").

The high-speed nonvolatile memory may be configured to operate according to a mapping scheme suitable for high-speed operation, while the low-speed nonvolatile memory may be configured to operate according to a mapping scheme suitable for low-speed operation. For example, the main region 111 forming the low-speed nonvolatile memory may be managed using a block mapping scheme, while the cache region 112 forming the high-speed nonvolatile memory may be managed using a page mapping scheme. Since the page mapping scheme does not necessitate the use of merge operations—that reduce (e.g.,) the write performance of the memory system, the cache region 112 will tend to operate at relatively higher speed. On the other hand, since the block mapping scheme necessitates the use of merge operations, the main region 111 will tend to operate at relatively lower speed.

In certain embodiments of the inventive concept, for example, the cache region 112 may be formed of a Single-Level Cell (SLC) flash memory that store 1 bit of data per memory cell, while the main region 111 may be formed of a Multi-Level Cell (MLC) flash memory that stores N-bit data (where N is an integer greater than 1) per memory cell. Alternatively, each of the main and cache regions 111 and 112 may be formed of the MLC flash memory. In this case, the MLC flash memory of the main region 111 may perform only a Least Significant Bit program operation such that it essentially operates like the SLC flash memory. Alternatively, each of the main and cache regions 111 and 112 may be formed of the SLC flash memory. The main region 111 and/or the cache region 112 may be implemented using a single memory device or using multiple memory devices.

The memory controller 120 may control read and write operations of the nonvolatile memory device 110 in response to a request of an external device (e.g., a host). The memory controller 120 of FIG. 1 includes a host interface 121, a memory interface 122, a control unit 123, a RAM 124, and a migration manager 125.

The host interface 121 may be configured to interface with the external device (e.g., a host). The memory interface 122 may be configured to interface with the nonvolatile memory device 110. The host interface 121 may be connected with the host (not shown) via one or more channels (or, ports) (not shown).

For example, the host interface 121 may be connected with the host via one of two channels, that is, a Parallel ATA (PATA) bus and a Serial ATA (SATA) bus. Alternatively, the host interface 121 can be connected with the external device via the PATA bus and the SATA bus. Alternatively, the host interface 121 can be connected with the external device via SCSI, USB, etc.

The control unit 123 may control an overall operation (including reading, writing, file system managing, etc.) associated with the nonvolatile memory device 110. For example, although not shown in FIG. 1, the control unit 123 may include a CPU, a processor, an SRAM, a DMA controller, an ECC engine, etc. One possible example of a control unit 123 that may be incorporated within a memory controller 120 consistent with certain embodiments of the inventive concept is disclosed in published U.S. Patent Publication Application 2006/0152981, the subject matter of which is hereby incorporated by reference.

The RAM 124 may operate responsive to the control of the control unit 123, and may be used as a work memory, a buffer memory, a cache memory, etc. The RAM 124 may be formed of a single chip or a plurality of chips corresponding to regions of the nonvolatile memory device 110, respectively.

In a case wherein the RAM 124 is used as a work memory, data processed by the control unit 123 may be temporarily stored in the RAM 124. In the event that the RAM 124 is used as a buffer memory, it may be used to buffer data being transferred to the nonvolatile memory device 110 from the host or to the host from the nonvolatile memory device 110. If the RAM 124 is used as a cache memory (hereinafter, referred to as a cache scheme), it may enable the low-speed nonvolatile memory device 110 to operate in a high speed. With the cache scheme, data stored in the cache memory (RAM 124) may be dumped into the cache region 112 of the nonvolatile memory device 110. The control unit 123 may manage a mapping table associated with the dump operation.

When the nonvolatile memory device 110 is a flash memory, the RAM 124 may be used as a driving memory in conjunction with a defined Flash Translation Layer (FTL). The FTL may be used to manage merge operations for the flash memory, a mapping table, etc.

Besides write and read operations, a host may command and the memory controller 120 may control execution of a cache "flush operation" within the memory system 100. In order to maintain data consistency and memory system operating speed, the memory system 100 may store file data stored in the cache memory 124 in the cache region 112 of the nonvolatile memory device 110 in response to a flush cache command. During a flush operation, the control unit 123 controls the "dumping" (i.e., the writing or copying) of data stored in the cache memory 124 to the cache region 112 of the nonvolatile memory device 110.

In contrast, during a migration operation, the migration manager 125 controls the "migration" (i.e., the writing or copying) of data stored in the cache region 112 of the nonvolatile memory device 110 to the main region 111. It should be noted that the data that ends up being stored in the cache region 112 may be thus stored for a number of reasons, and according to a number of different memory system operations. As mentioned above, the data may have been dumped to the cache region 112 of the nonvolatile memory device 110 from the cache memory 124 by a flush operation. Alternately, the data may be programmed to the cache memory 124 by the host using a program operation. Examples of the operation of the migration manager 125 will be more fully described with reference to FIGS. 2 and 3.

Figure 2:
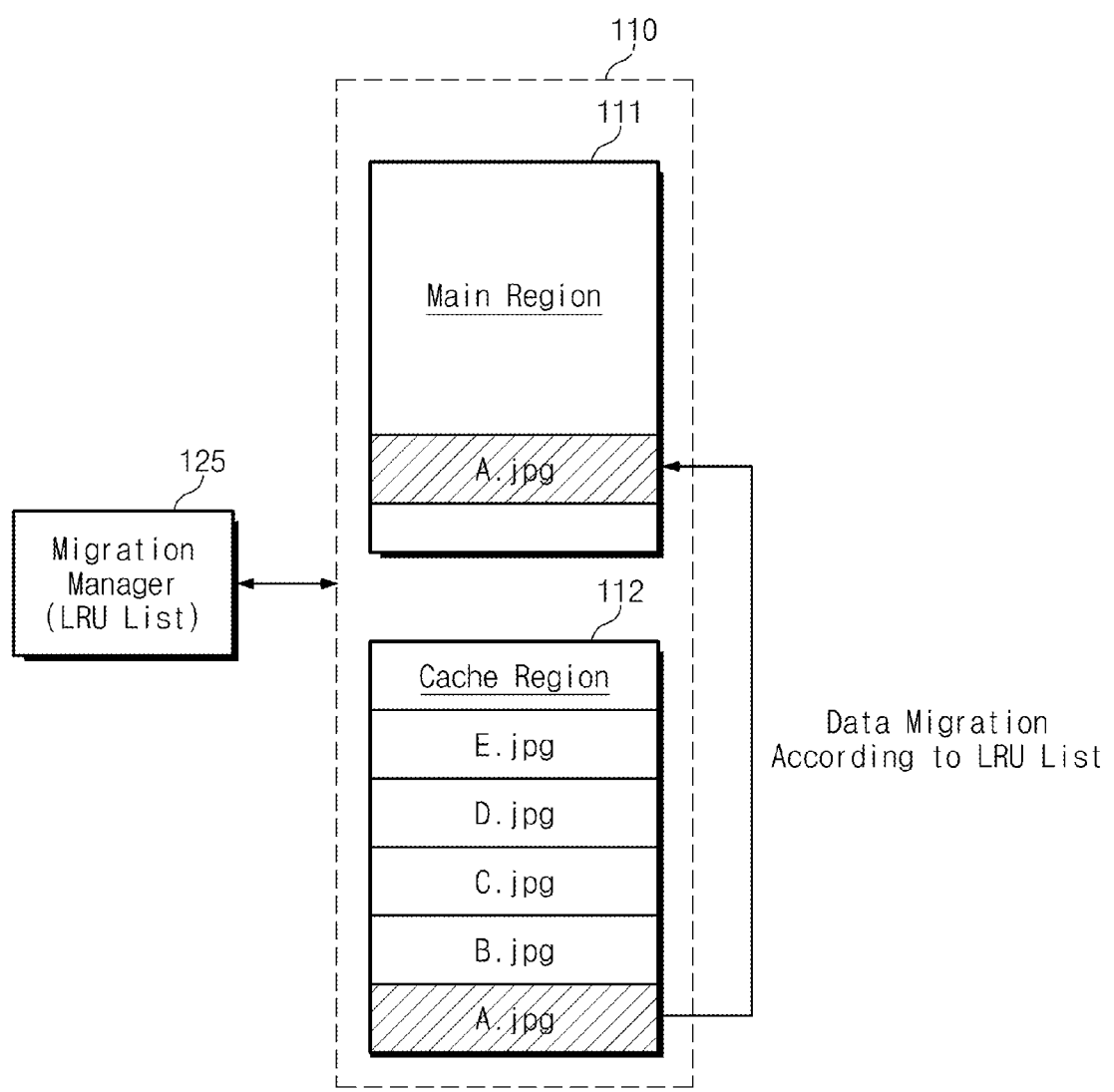
FIG. 2 is a diagram further describing operation of the migration manager of FIG. 1.

FIG. 2 is a conceptual diagram further describing operation of the migration manager 125 of FIG. 1. In FIG. 2, data stored in the cache region 112 is "migrated to" (i.e., moved) to the main region 111 in accordance with a Least Recently Used (LRU) list reference by the migration manger 125. During a migration operation, data may be stored at corresponding physical address(es) for the main region 111. Management of and operation in reference to the LRU list by the migration manager 125 will be more fully described with reference to FIG. 3.

Referring to FIG. 2, it is assumed that the main region 111 and/or the cache region 112 include a plurality of memory blocks, each memory block including a plurality of pages. In FIG. 2, file data A.jpg to E.jpg is stored in a corresponding page in one or more memory blocks. Herein, each memory block may be an erase unit, and each page may be a write unit.

Moving data to the main region 111 from the cache region 112 during a migration operation may be done in a variety of manners. For example, the migration operation may be performed according to whether "available space" in the cache region 112 is below a predetermined threshold (e.g., 30%). Alternatively, the migration operation may be performed periodically, or as part of a regularly occurring memory system maintain routine. Alternatively, the migration operation may be executed during idle time for the nonvolatile memory device 110.

In FIG. 2, it is assumed that during a migration operation, begun when the available space in the cache region 112 falls below a certain threshold, file data A.jpg being first stored (or, the "oldest data") is moved from the cache region 112 to the main region 111. For example, the migration operation moving the file data A.jpg may commence when the amount of "used space" in the cache region 112 exceeds a first threshold (e.g., 70% used) or when the amount of available space falls below 30%. Once begun, the migration operation may continue until the amount of used space falls below (or the amount of available space exceeds) a second threshold (e.g., 30% used).

Figure 3:
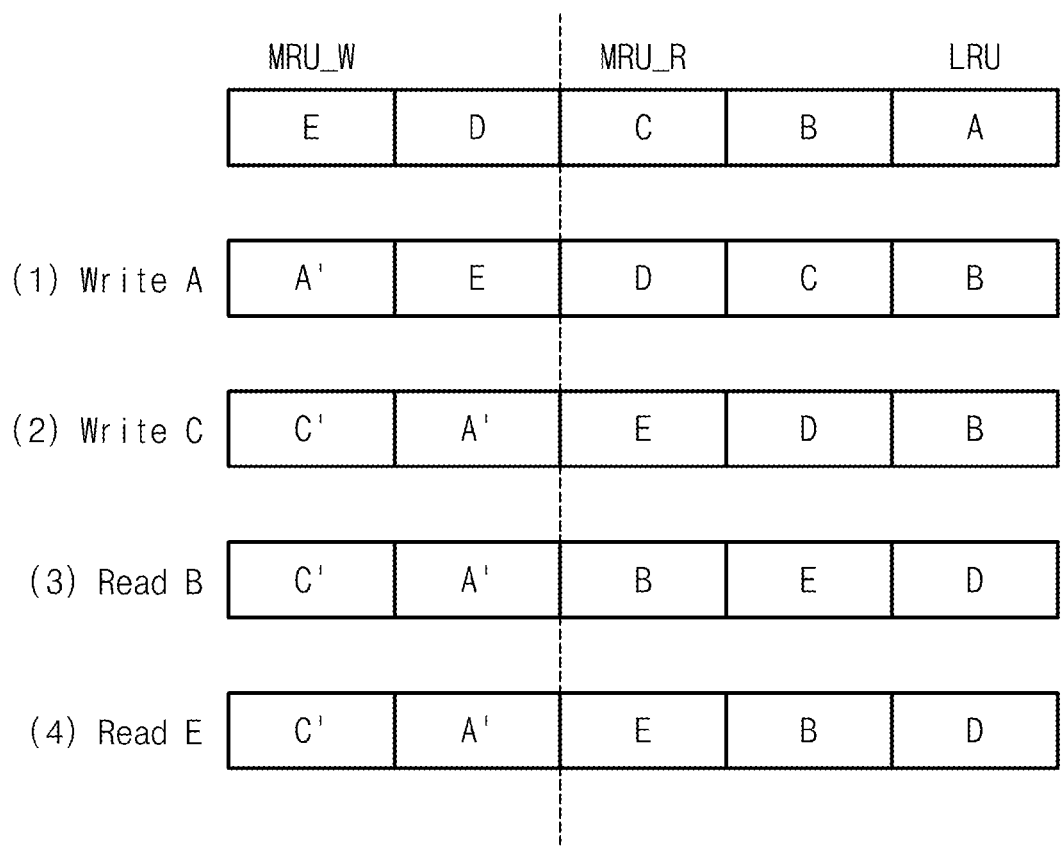
FIG. 3 is a diagram further describing MRU/LRU list management by the migration manager of FIG. 2.

FIG. 3 is a conceptual diagram further describing management of the LRU list by the migration manager 125 of FIGS. 1 and 2. The LRU list is essentially an index that manages available/used memory space in such a manner that a least used or lesser used portion of memory space is "next' used (i.e., used first in a next operation, such as a migration operation). Hence, a record of "stored files data units" (i.e., file data segments stored according to a defined unit) may be queued (or accounted for) in the LRU list from "oldest file data" to "newest file data" according to (e.g.,) a header portion of the respective file data units. View from the opposite perspective, the LRU list alternately or additionally may be interrupted to identify Most Recently Used (MRU) memory space, and may hence be said to a MRU list.

For example, identification information for a most recently written file data may be stored in a MRU_W entry of the LRU list. In similar vein, identification information for a most recently read file data may be stored in a MRU_R entry of the LRU list.

By analyzing the frequency and/or pattern with which each data file is accessed within the memory system, a "read number" indicating a number of read operations directed to each read file data may be obtained. It is well understood that the frequency with which a particular file data is read is an indicator of future read operation likelihood.

Flash memory consumes much more power during a write operation than during a read operation. Accordingly, it may be advantageous to store data being frequently written in the cache region 112 with a higher endurance. For this reason, embodiments of the inventive concept may be implemented to divide an MRU list by separate read data (MRU_R) and write data (MRU_W).

In general, data having a high read/write frequency may be referred to as "hot data", while data having a relatively low read/write frequency may be referred to as "cold data". Accordingly, identification information for hot data verses cold data will be differently stored in a MRU/LRU list. In certain embodiments of the inventive concept, cold data—as indicated by the entries in a MRU/LRU list—may be moved from the cache region 112 to the main region 111, while hot data is retained in the cache region 112.

In FIG. 3, it is assumed that file data units A through E are sequentially stored in the cache region 112. That is, when a write operation for file data A is executed, a corresponding list "entry" (e.g., identification information) A' is made to a "MRU side" of the MRU/LRU list (MRU_W) and existing entries E through B are shifted towards the "LRU side" of the MRU/LRU list. Next, when a write operation for file data C is executed, a corresponding list entry C' is made to the MRU side of the MRU/LRU list and the existing entries A' and E through B shifted towards the LRU side.

Next, when a read operation is directed to the file data B, the file data B moves to MRU read location of the MUR/LRU list (MRU_R), thereby shifting file data entries E and D towards the LRU side. However, entries in the MRU write locations are not changed by execution of the read operation. Thus, when a next read operation is directed to file data E, the entry for the file data E is moved "up queue" to the MRU read location, but entries for the file data A' and C' in the MRU write side (MRU_W) are not changed.

Thus, in the example of FIG. 3, a MRU/LRU list is arranged in a queue from a top (highest) location to a bottom (lowest) location with higher queue locations being designated for entries "related to" (i.e., identifying) file data units most recently written to the cache region 112, and lower queue locations being designated for entries related to file data units least recently written to the cache region 112. However, entries in the MRU/LRU list related to data files less recently written may be "moved up queue" when a read operation is directed to them, provided however, that MRU read entries remain "further down" the queue of the MRU/LRU list than MRU write entries.

Figure 4:
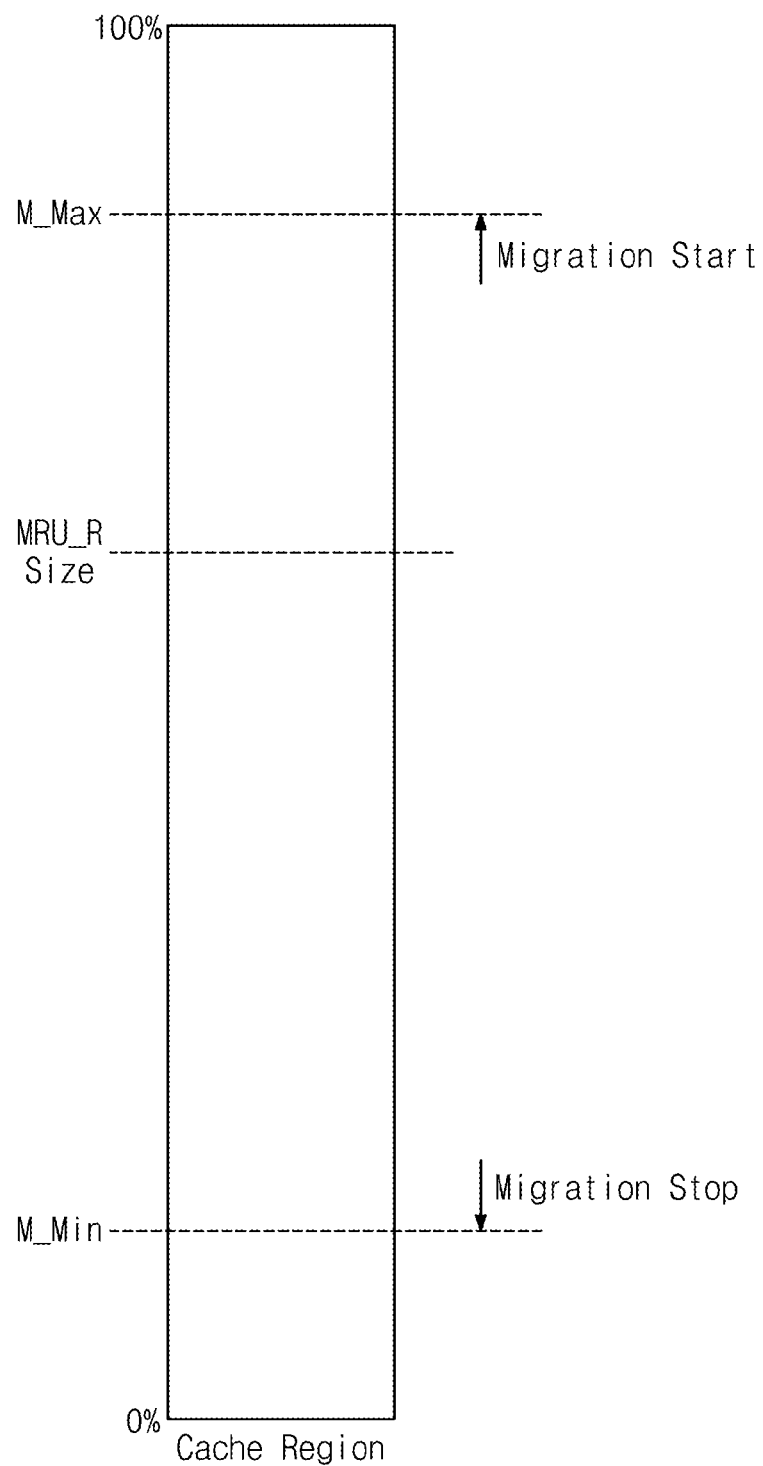
FIG. 4 is a diagram further describing a method of using the cache region illustrated in FIG. 1.

FIG. 4 is a conceptual diagram further describing a migration operation that may be used in relation to the cache region 112 of FIG. 1. In FIG. 4, start and stop points for the migration operation are illustrated.

Referring to FIG. 4, the migration operation may start when the cumulative size of file data stored in the cache region 112 exceeds a first threshold (M_Max) and may stop when as a result of the migration operation the cumulative size of file data stored in the cache region 112 falls below a second threshold (M_Min). The threshold values M_Max and M_Min may be adjusted by a user. For example, the migration manager 125 of FIG. 2 may start the migration operation when the amount used space in the cache region 112 exceeds 70% of the cache region 112, and may stop the migration operation when the amount used space in the cache region 112 falls below 30% of the cache region 112. The cumulative size of file data stored in the cache memory 112 may be periodically checked by the migration manager 125 relative to the defined thresholds.

Continuing to refer to FIG. 4, the migration manager 125 may also be used to manage the amount of used space in the cache region 112, as between read data and write data by managing the a size of a so-called MRU read portion (MRU_R). Thus, in effect a third threshold may be established to protect hot read data, where the second threshold M_Min is used to protect hot write data.

A memory system 100 according to an embodiment of the inventive concept may be configured to separate hot data and cold data and to move the cold data into the main region 111 from the cache region 112. Further, the inventive concept may manage an MRU/LRU list such that data having a high write access frequency remains at the cache region 112 longer than data having a high read access frequency. Within embodiments of the inventive concept, it is possible to reduce migration of file data between the cache region 112 and the main region 111 and an erase count for the main region 111.

Figure 5:
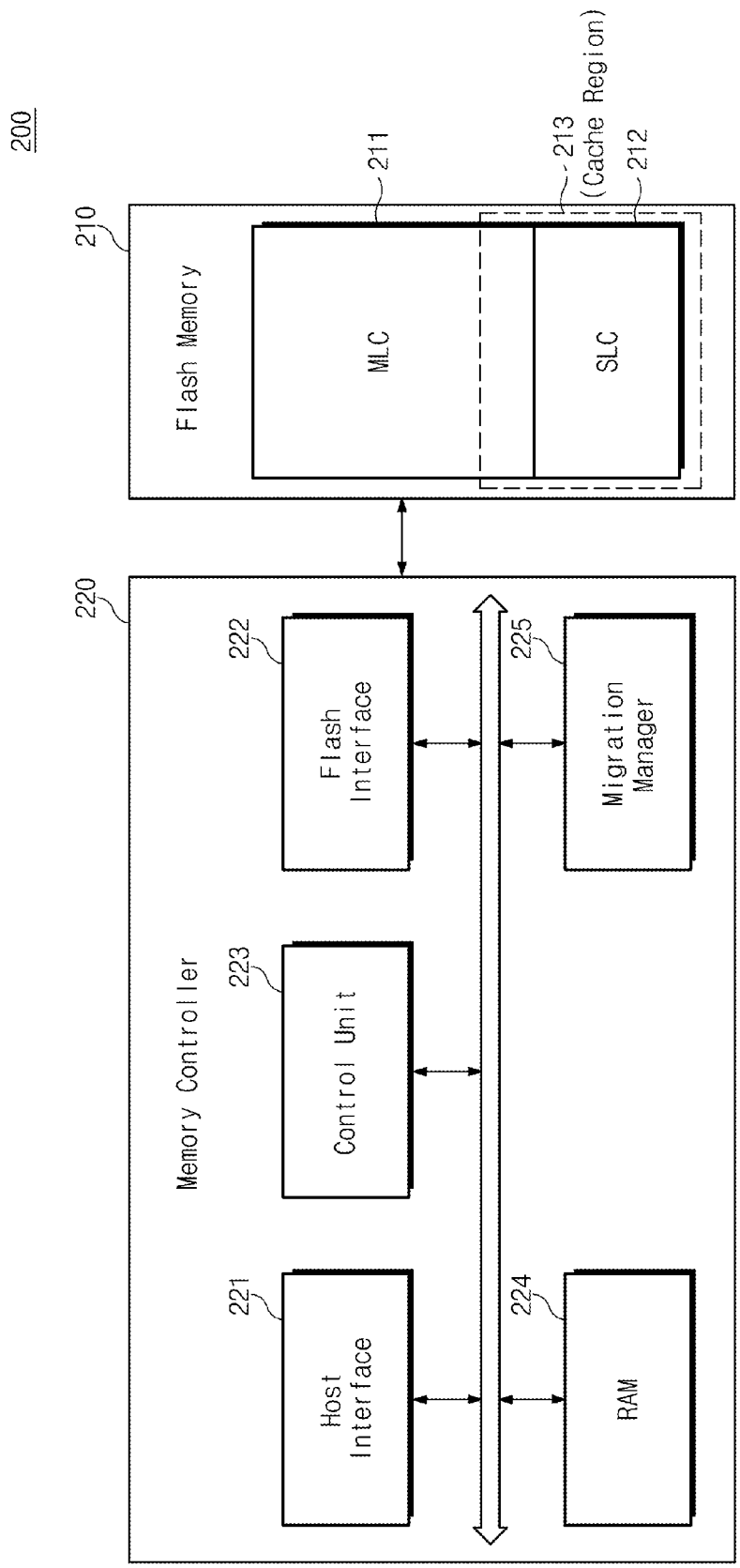
FIG. 5 is a block diagram illustrating a memory system according to another embodiment of the inventive concept.

FIG. 5 is a block diagram illustrating a memory system according to another embodiment of the inventive concept. Referring to FIG. 5, a memory system 200 generally comprises a flash memory device 210 and a memory controller 220.

The flash memory device 210 includes an MLC region 211 and an SLC region 212. Herein, the MLC and SLC regions 211 and 212 may be implemented by one memory device or by separate memory devices, respectively. The MLC region 211 may be configured to use a block mapping scheme suitable for a low-speed operation, and the SLC region 212 may be configured to use a page mapping scheme suitable for a high-speed operation.

The memory controller 220 may control read and write operations of the flash memory device 210 in response to a request of an external device (e.g., a host). The memory controller 220 may include a host interface 221, a flash interface 222, a control unit 223, a RAM 224, and a migration manager 225.

The host interface 221 may be configured to interface with a host. The flash interface 222 may be configured to interface with the flash memory device 210. The control unit 223 may control an overall operation (including reading, programming, erasing, file system managing, etc.) associated with the flash memory device 210. The RAM 224 may operate responsive to the control of the control unit 223, and may be used as a work memory, a buffer memory, a cache memory, etc. The migration manager 225 may manage a migration operation of the flash memory device 210. That is, the migration manager 225 may mange the movement of data stored in a cache region to a main region.

Referring to FIG. 5, a cache region 213 of the flash memory device 210 may include an SLC region 212 and a part of an MLC region 211. That is, the migration manager 225 may use part of the MLC region 211 as a cache region (hereinafter, referred to as an MLC cache region) when the size of file data stored in the SLC region 212 exceeds M_Max (refer to FIG. 4). Once file data stored in the MLC cache region migrates to the MLC main region, the MLC cache region may be used as just another part of the main region again. For example, file data stored in the MLC cache region may be moved to the MLC main region during idle time for the memory system 200.

Figure 6:
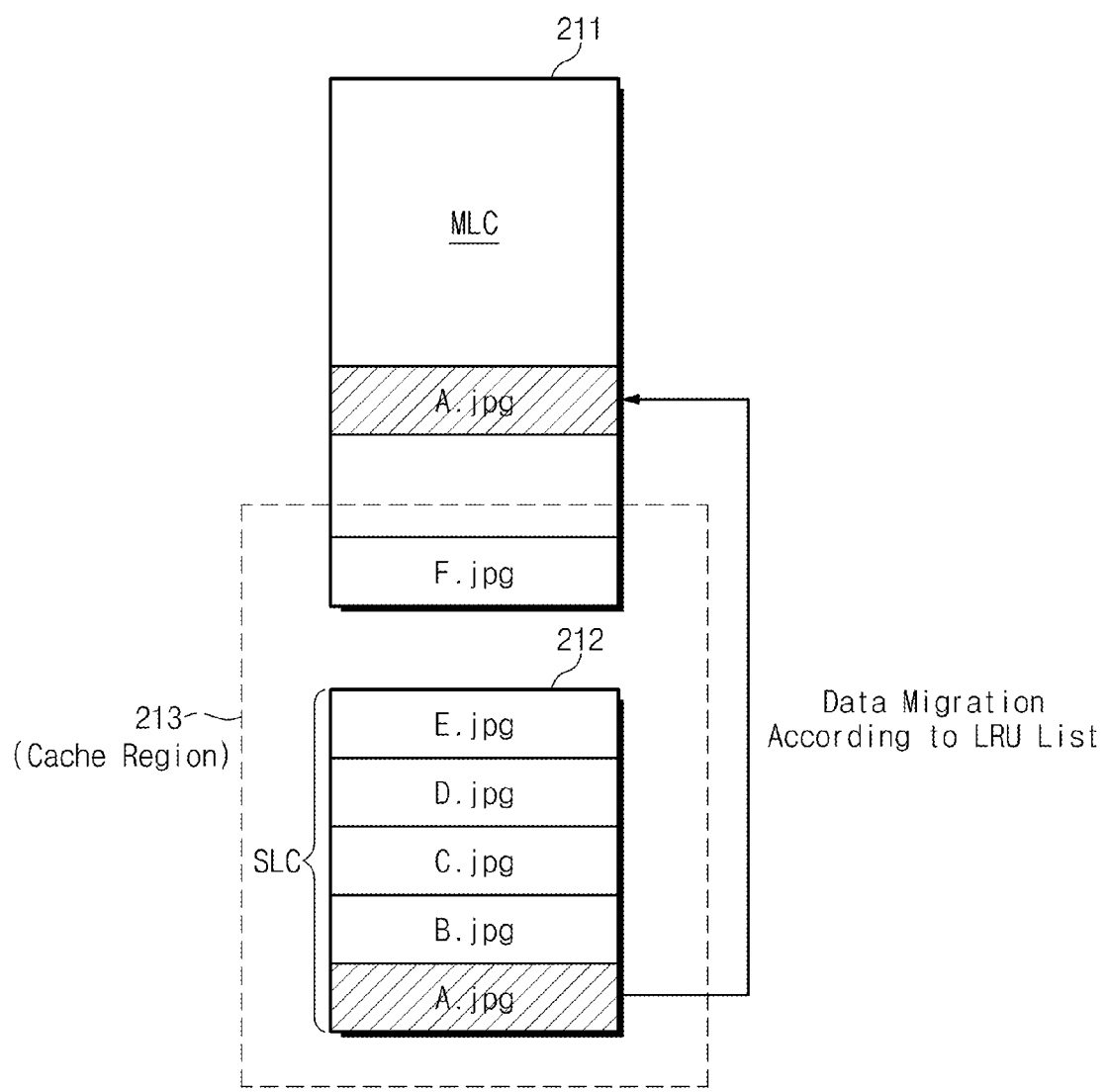
FIG. 6 is a diagram illustrating an operation where file data of a cache region illustrated in FIG. 5 migrates into a main region.

FIG. 6 is a conceptual diagram illustrating operation of the memory system 200 wherein file data is stored in the cache region 213 and main region 211 of FIG. 5. Thus, the memory system 200 may move file data (e.g., A.jpg to E.jpg) stored in an SLC region 212 into an MLC region 211 with reference to a MRU/LRU list by the migration manager 225.

In a case where there is no available space in the SLC region 212, the migration manager 225 may cause file data to be stored in part of the MLC region 211 (e.g., file data F.jpg). The file data F.jpg initially stored in the MCL cache region may subsequently be moved to the MLC main region using various operations. For example, the file data F.jpg stored in the MCL cache region may be moved prior to file data A.jpg to E.jpg assigned to the SLC cache region or during idle time.

Hence, the memory system 200 according to an embodiment of the inventive concept may perform a migration operation efficiently although available space in the SLC region is insufficient.

Figure 7:
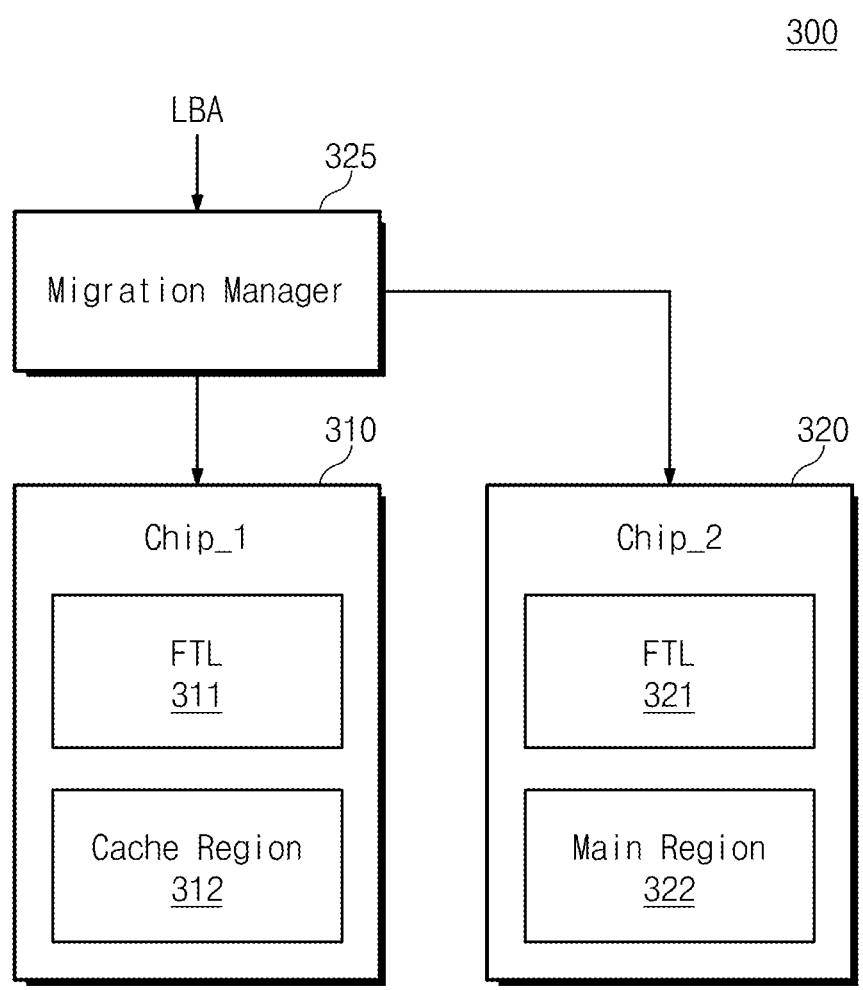
FIG. 7 is a block diagram illustrating a memory system according to still another embodiment of the inventive concept.

FIG. 7 is a block diagram illustrating a memory system according to still another embodiment of the inventive concept. Referring to FIG. 7, a memory system 300 comprises a first memory chip 310, a second memory chip 320, and a migration manager 325.

The first memory chip 310 may include a first flash translation layer 311 and a cache region 312, and the second memory chip 320 may include a second flash translation layer 321 and a main region 322. Herein, the cache region 312 may be an SLC flash memory, and the main region 322 may be an MLC flash memory.

Each of the first and second flash translation layers 311 and 321 may be software for managing a mapping operation of data stored in the cache region 312 and the main region 322. For example, the first flash translation layer 311 may use a page mapping operation, and the second flash translation layer 321 may use a block mapping operation.

The migration manager 325 may manage an operation where file data stored in the cache region 312 of the first memory chip 310 is moved into the main region 322 of the second memory chip 320. The memory system 300 according to the inventive concept may perform a migration operation between different chips. A migration operation for the memory system 300 may as described above in relation to FIGS. 1 to 6.

Figure 8:
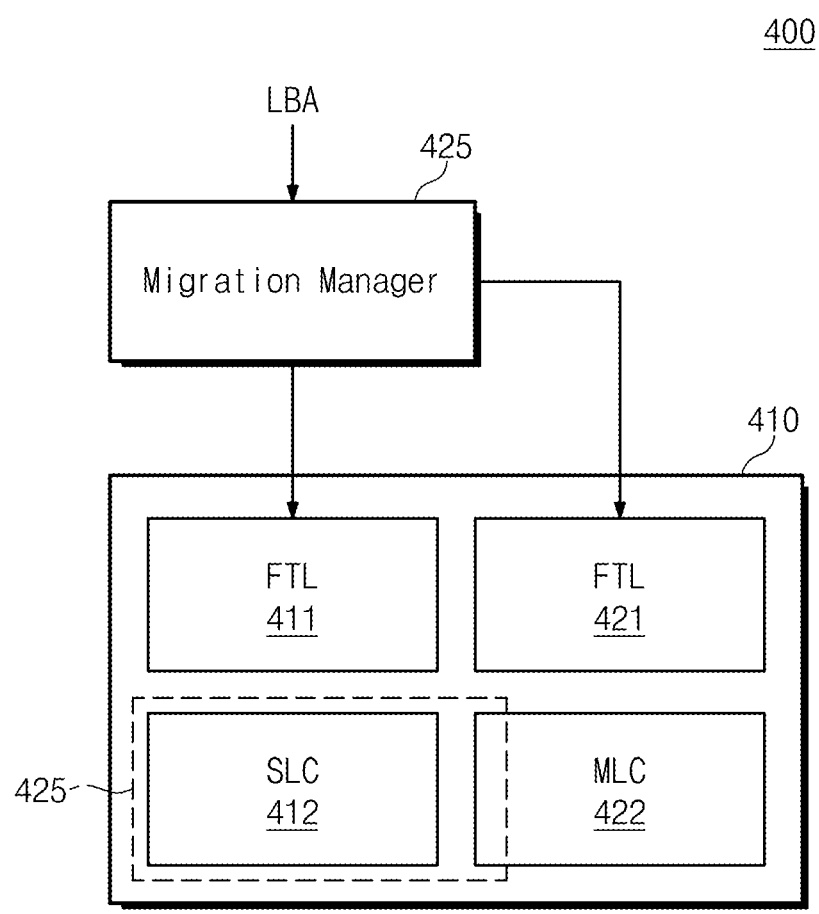
FIG. 8 is a block diagram illustrating a memory system according to still another embodiment of the inventive concept.

FIG. 8 is a block diagram illustrating a memory system according to still another embodiment of the inventive concept. Referring to FIG. 8, a memory system 400 comprises a memory chip 410 and a migration manager 425.

The memory chip 410 may include a first flash translation layer 411, an SLC region 412, a second flash translation layer 421, and an MLC region 422. The first and second flash translation layers 411 and 421 may manage mapping operations of data stored in the SLC and MLC regions 412 and 422, respectively. The memory system 400 according to the inventive concept may use a part of the MLC region 422 as a cache region 425. That is, when a spare space of the SLC region 412 is insufficient, a part of the MLC region 422 may be used as the cache region 425.

The migration manager 425 may manage an operation where file data stored in the SLC region 412 or the cache region 425 is moved into the MLC region 422 or a main region (the remaining of the MLC region 422). The memory system 400 according to the inventive concept may perform a migration operation within the same memory chip. A migration operation of the memory system 400 illustrated in FIG. 8 may be as the operations described in relation to FIGS. 5 and 6.

Figure 9:
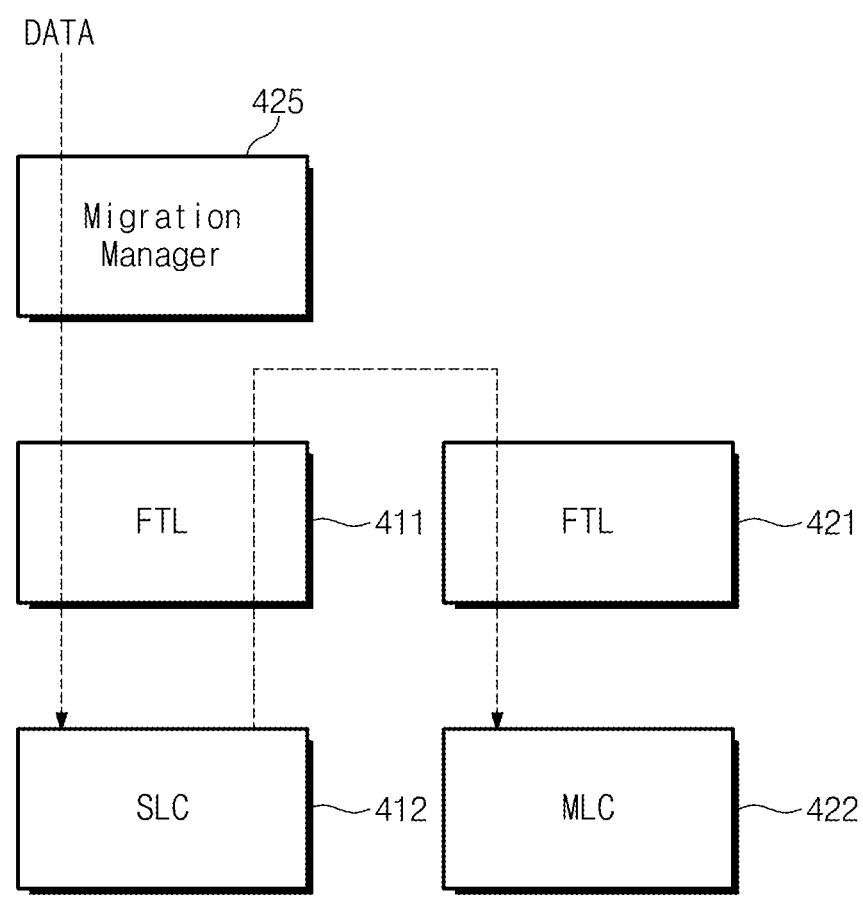
FIGS. 9 and 10 are block diagrams for describing write and read operations of a memory system illustrated in FIG. 7 or 8.
Figure 10:
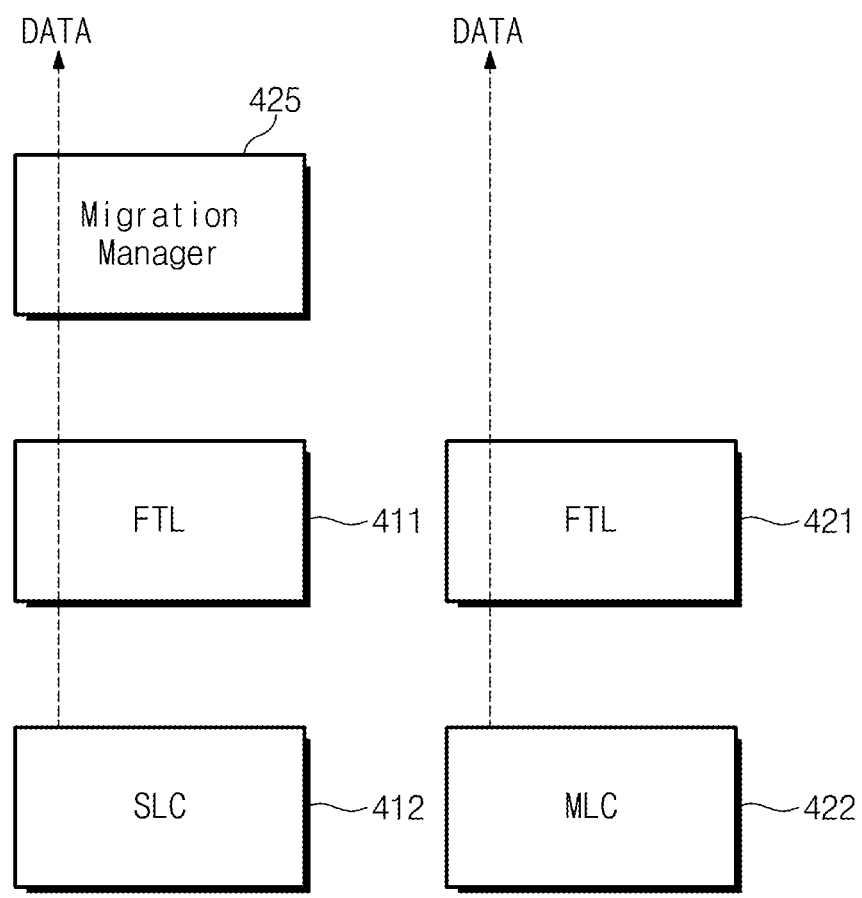

FIGS. 9 and 10 are block diagrams further describing write/read operations for the memory systems of FIGS. 7 and 8. Referring to FIG. 9, data may be stored in an SLC region 412 according to a data managing method of a migration manager 425. A first flash translation layer 411 may manage a mapping table of data stored in the SLC region 412. The migration manager 425 may manage cold data to be moved into an MLC region 422 according to an LRU list. A second flash translation layer 421 may manage a mapping table of data stored in the MLC region 422.

Referring to FIG. 10, in response to a read request of a host (not shown), a migration manager 425 may judge whether data is stored in the SLC region 412. If data is stored in the SLC region 412, SLC data may be read according to a mapping table of the first flash translation layer 411. If no data is stored in the SLC region 412, the migration manager 425 may bypass a read command to the MLC region 422 to read MLC data based upon a mapping table of the second flash translation layer 421.

A memory system according to embodiments of the inventive concept may be applied to various products, such as a personal computer, a digital camera, a camcorder, a handheld phone, an MP3, a PMP, a PSP, a PDA, etc. and at a storage device such as a memory card, an USB memory, a solid state driver (SSD), etc.

Figure 11:
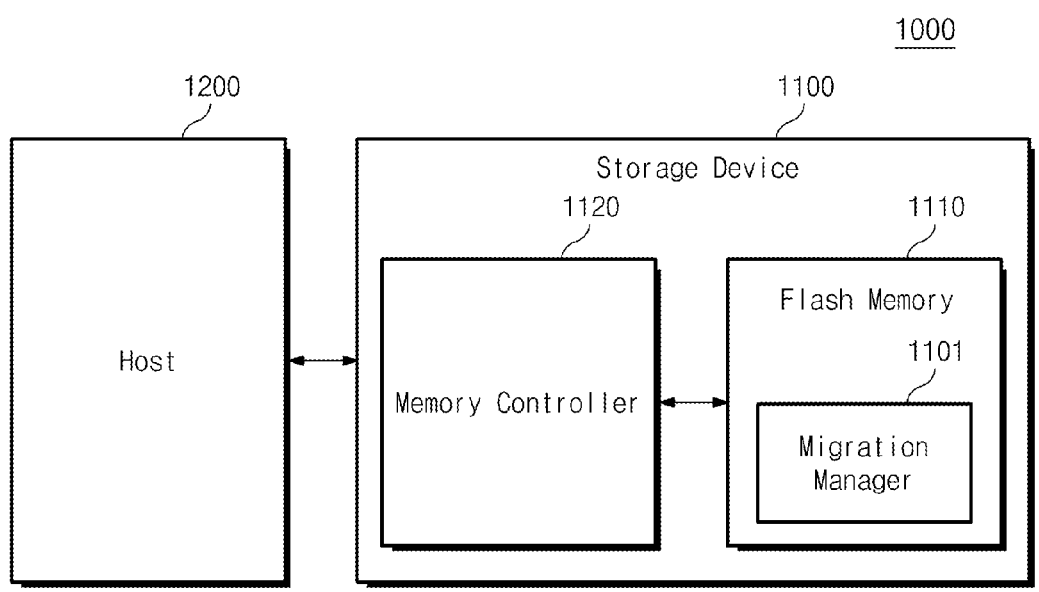
FIGS. 11 and 12 are block diagrams illustrating applications including a memory system according to the inventive concept.
Figure 12:
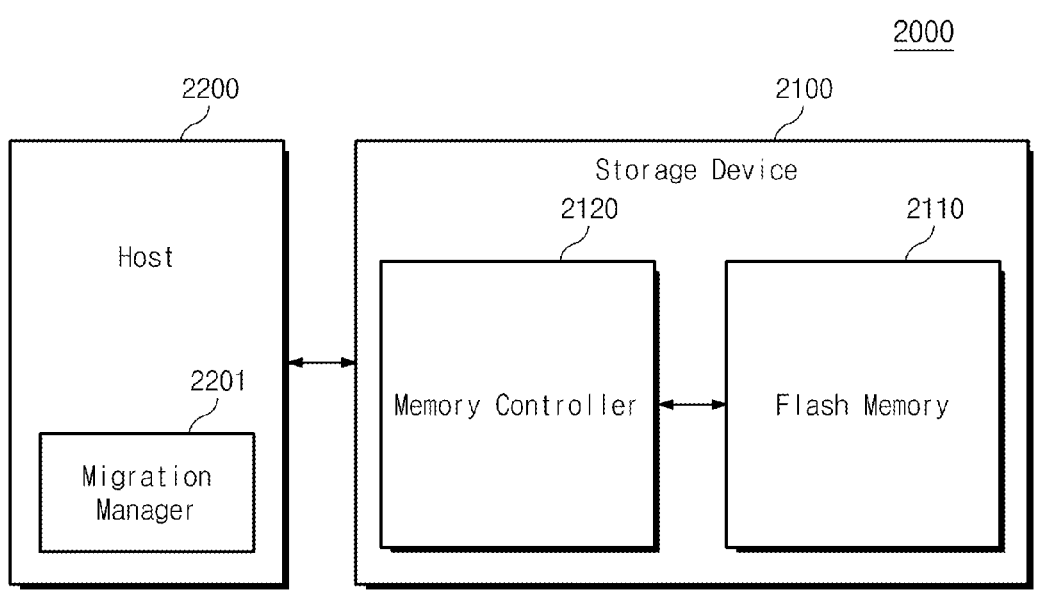

FIGS. 11 and 12 are block diagrams illustrating applications including a memory system according to embodiments of the inventive concept. Referring to FIGS. 11 and 12, a memory system 1000/2000 comprises a storage device 1100/2100 and a host 1200/2200. The storage device 1100/2100 may include a flash memory 1110/2110 and a memory controller 1120/2120.

The storage device 1100/2100 may include a storage medium such as a memory card (e.g., SD, MMC, etc.) or an attachable handheld storage device (e.g., an USB memory). The storage device 1100/2100 may be connected with the host 1200/2200. The storage device 1100/2100 may transmit and receive data to and from the host via a host interface. The storage device 1100/2100 may be supplied with a power from the host 1200/2200.

Referring to FIG. 11, a migration manager 1101 may be included in a flash memory 1110. Referring to FIG. 12, a migration manager 2101 may be included in a host 2200. Memory systems 1000 and 2000 according to the inventive concept may reduce a migration of file data between a cache region of a nonvolatile memory device and a main region thereof and an erase count of the main region. Further, the inventive concept may perform a migration operation efficiently although a space of an SLC region to be used is insufficient. This may be accomplished by assigning a part of an MLC region of the nonvolatile memory device to a cache region.

Figure 13:
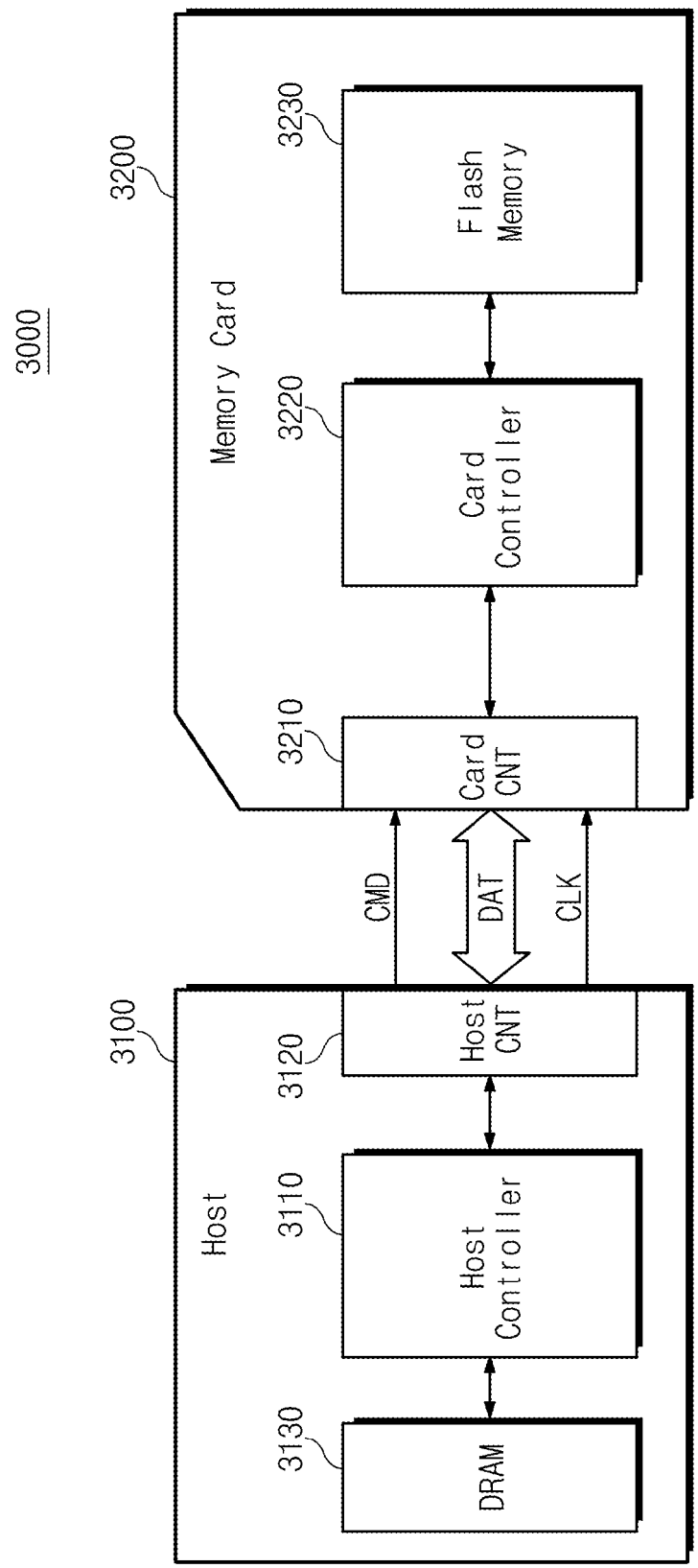
FIG. 13 is a block diagram illustrating a memory card system to which a memory system according to an embodiment of the inventive concept is applied.

FIG. 13 is a block diagram illustrating a memory card system to which a memory system according to an embodiment of the inventive concept is applied. A memory card system 3000 may include a host 3100 and a memory card 3200. The host 3100 may include a host controller 3110, a host connection unit 3120, and a DRAM 3130.

The host 3100 may write data in the memory card 3200 and read data from the memory card 3200. The host controller 3110 may send a command (e.g., a write command), a clock signal CLK generated from a clock generator (not shown) in the host 3100, and data to the memory card 3200 via the host connection unit 3120. The DRAM 3130 may be a main memory of the host 3100.

The memory card 3200 may include a card connection unit 3210, a card controller 3220, and a flash memory 3230. The card controller 3220 may store data in the flash memory 3230 in response to a command input via the card connection unit 3210. The data may be stored in synchronization with a clock signal generated from a clock generator (not shown) in the card controller 3220. The flash memory 3230 may store data transferred from the host 3100. For example, in a case where the host 3100 is a digital camera, the flash memory 3230 may store image data.

A memory card system 3000 illustrated in FIG. 13 may include a migration manager (not shown) within the host controller 3110, the card controller 3220, or the flash memory 3230. As described above, the inventive concept may reduce a migration of file data between a cache region of the flash memory 3230 and a main region thereof and an erase count of the main region. Further, the inventive concept may perform a migration operation efficiently although a space of an SLC region to be used is insufficient. This may be accomplished by assigning a part of an MLC region of the flash memory 3230 to a cache region.

Figure 14:
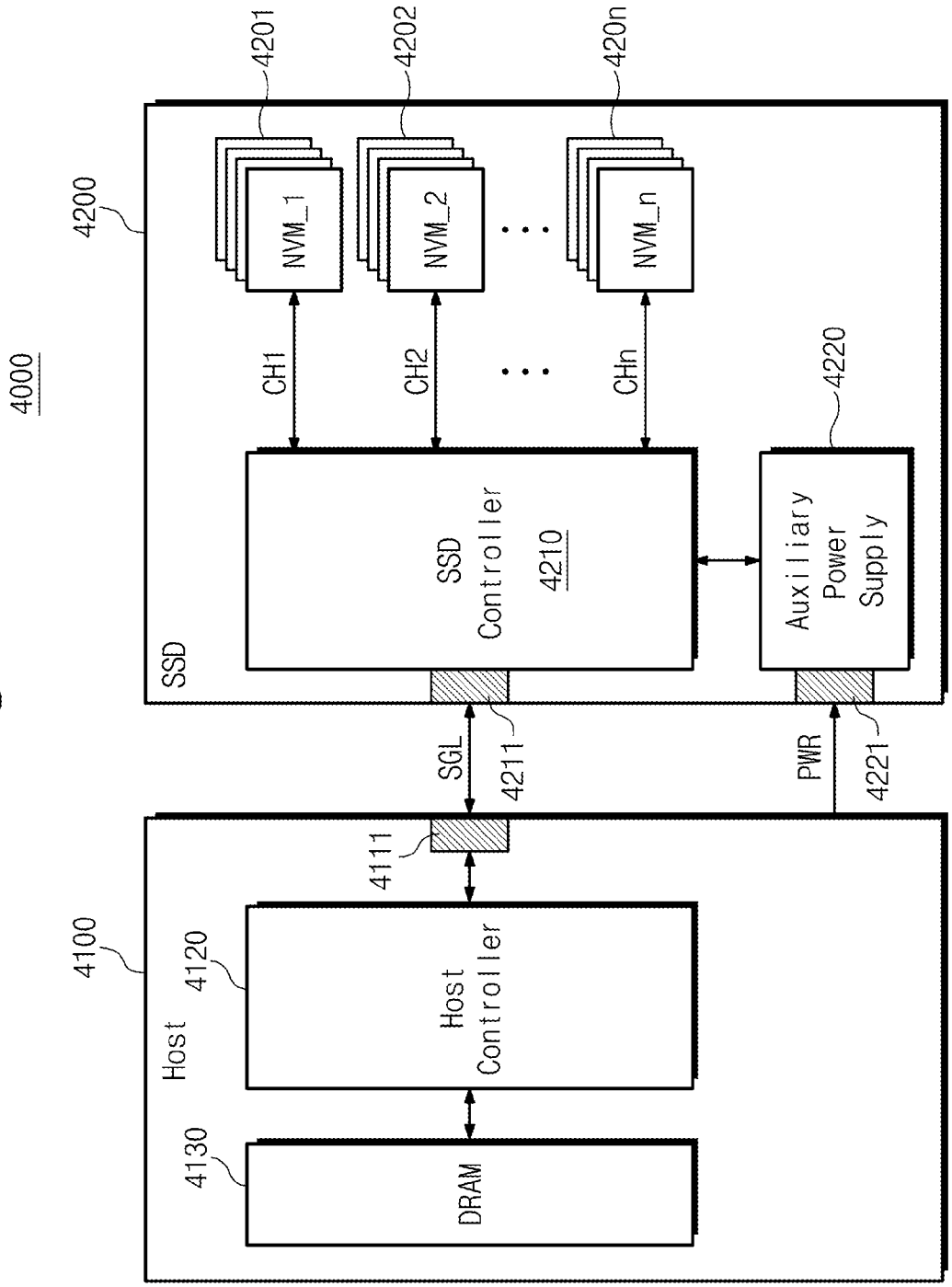
FIG. 14 is a block diagram illustrating a solid state drive (SSD) system including a memory system according to an embodiment of the inventive concept.

FIG. 14 is a block diagram illustrating a solid state drive system including a memory system according to an embodiment of the inventive concept. Referring to FIG. 14, a solid state drive (SSD) system 4000 may include a host 4100 and an SSD 4200. The host 4100 may include a host interface 4111, a hard disk drive (HDD) 4110, a host controller 4120, and a DRAM 4130.

The host 4100 may write data in the SSD 4200 or read data from the SSD 4200. The host controller 4120 may transfer signals SGL such as a command, an address, a control signal, etc. to the SSD 4200 via the host interface 4111. The DRAM 4130 may be a main memory of the host 4100.

The SSD 4200 may exchange signals SGL with the host 4100 via the host interface 4211 and may be supplied with a power via a power connector 4221. The SSD 4200 may include a plurality of nonvolatile memories 4201 to 420$n$, an SSD controller 4210, and an auxiliary power supply 4220. Herein, the nonvolatile memories 4201 to 420$n$ may be implemented by not only a flash memory but also PRAM, MRAM, ReRAM, etc.

The plurality of nonvolatile memories 4201 to 420$n$ may be used as a storage medium of the SSD 4200. The plurality of nonvolatile memories 4201 to 420$n$ may be connected with the SSD controller 4210 via a plurality of channels CH1 to CHn. One channel may be connected with one or more nonvolatile memories. Nonvolatile memories connected with one channel may be connected with the same data bus.

The SSD controller 4210 may exchange signals SGL with the host 4100 via the host interface 4211. Herein, the signals SGL may include a command, an address, data, and the like. The SSD controller 4210 may be configured to write or read out data to or from a corresponding nonvolatile memory according to a command of the host 4100. The SSD controller 4210 will be more fully described with reference to FIG. 15.

The auxiliary power supply 4220 may be connected with the host 4100 via the power connector 4221. The auxiliary power supply 4220 may be charged by a power PWR from the host 4100. The auxiliary power supply 4220 may be placed within the SSD 4200 or outside the SSD 4200. For example, the auxiliary power supply 4220 may be put on a main board to supply an auxiliary power to the SSD 4200.

Figure 15:
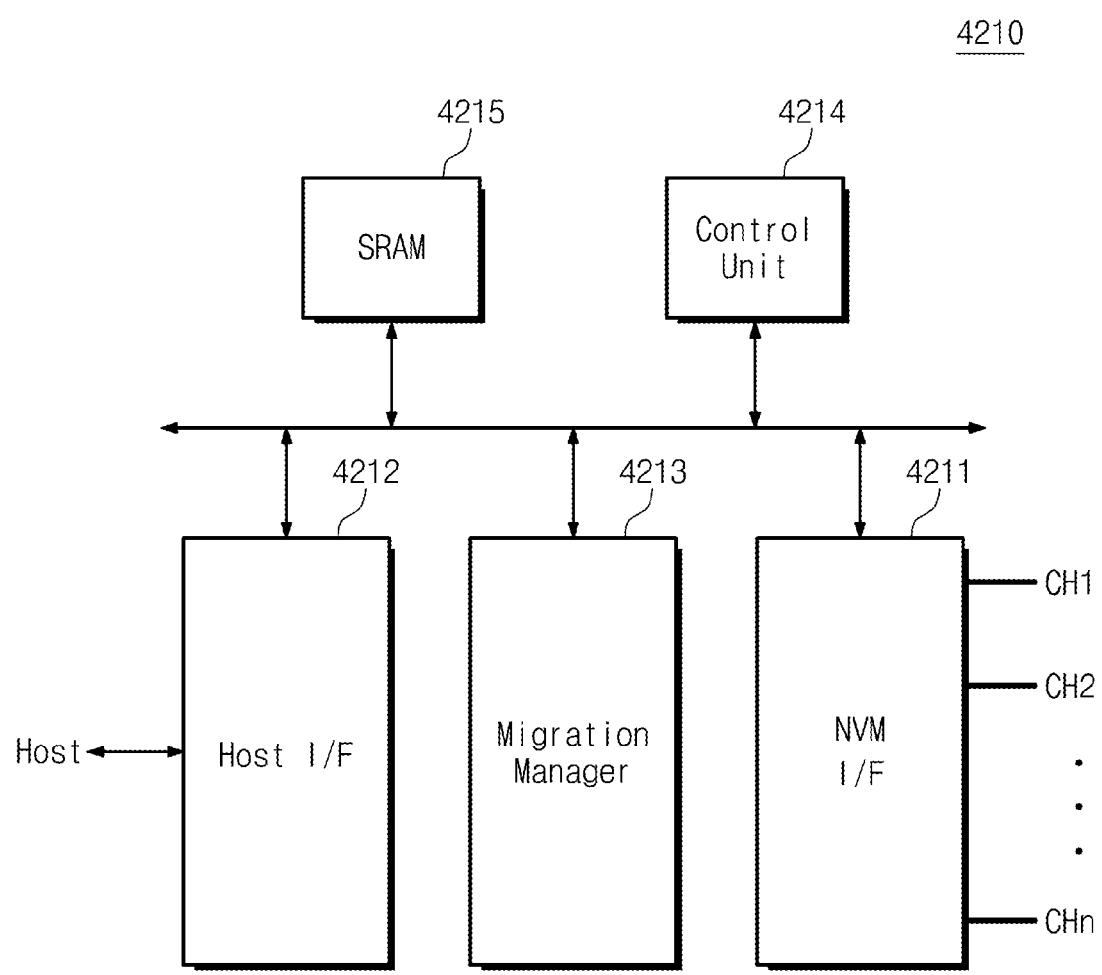
FIG. 15 is a block diagram illustrating an SSD controller in FIG. 14.

FIG. 15 is a block diagram further illustrating the SSD controller 4210 of FIG. 14. Referring to FIG. 15, the SSD controller 4210 comprises an NVM interface 4211, a host interface 4212, a migration manager 4213, control unit 4214, and an SRAM 4215.

The NVM interface 4211 may scatter data transferred from a main memory of a host 4100 to channels CH1 to CHn, respectively. The NVM interface 4211 may transfer data read from nonvolatile memories 4201 to 420*n* to the host 4100 via the host interface 4212.

The host interface 4212 may provide an interface with an SSD 4200 according to the protocol of the host 4100. The host interface 4212 may communicate with the host 4100 using USB (Universal Serial Bus), SCSI (Small Computer System Interface), PCI express, ATA, PATA (Parallel ATA), SATA (Serial ATA), SAS (Serial Attached SCSI), etc. The host interface 4212 may perform a disk emulation function which enables the host 4100 to recognize the SSD 4200 as a hard disk drive (HDD).

The migration manager 4213 may manage a migration operation of the nonvolatile memories 4201 to 420*n* as described above. The control unit 4214 may analyze and process signals SGL input from the host 4100. The control unit 4214 may control the host 4100 via the host interface 4212 or the nonvolatile memories 4201 to 420*n* via the NVM interface 4211. The control unit 4214 may control the nonvolatile memories 4201 to 420*n* using firmware for driving the SSD 4200.

The SRAM 4215 may be used to drive software which efficiently manages the nonvolatile memories 4201 to 420*n*. The SRAM 4215 may store metadata input from a main memory of the host 4100 or cache data. At a sudden power-off operation, metadata or cache data stored in the SRAM 4215 may be stored in the nonvolatile memories 4201 to 420*n* using an auxiliary power supply 4220.

Returning to FIG. 14, the SSD system 4000 may reduce necessary migration of file data between a cache region of the nonvolatile memories 4201 to 420*n* and a main region thereof and an erase count of the main region. Further, embodiments of the inventive concept may perform migration operations efficiently although available space in an SLC region is insufficient. This may be accomplished by assigning a part of an MLC region of the nonvolatile memories 4201 to 420*n* to a cache region.

Figure 16:
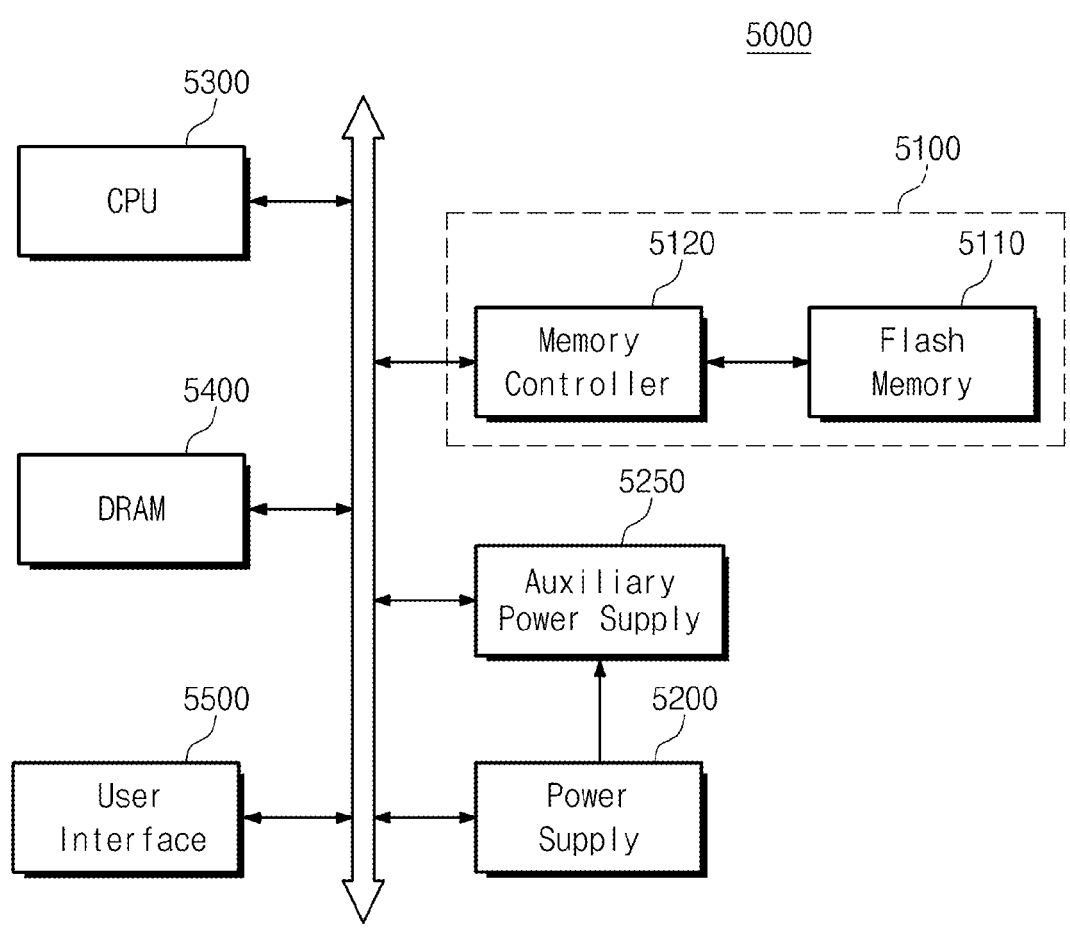
FIG. 16 is a block diagram illustrating an electronic device including a memory system according to an embodiment of the inventive concept.

FIG. 16 is a block diagram illustrating an electronic device including a memory system according to an embodiment of the inventive concept. Herein, an electronic device 5000 may be a personal computer or a handheld electronic device such as a notebook computer, a cellular phone, a PDA, a camera, etc.

Referring to FIG. 16, the electronic device 5000 generally comprises a memory system 5100, a power supply device 5200, an auxiliary power supply 5250, a CPU 5300, a DRAM 5400, and a user interface 5500. The memory system 5100 may be embedded within the electronic device 5000.

As described above, the electronic device 5000 may reduce necessary migration of file data between a cache region of a flash memory 5110 and a main region thereof and an erase count of the main region. Further, embodiments of the inventive concept may perform a migration operation efficiently although a space of an SLC region to be used is insufficient. This may be accomplished by assigning a part of an MLC region of the flash memory 5110 to a cache region.

The foregoing memory systems according to embodiments of the inventive concept have been described in the context of flash memory arranged in a two-dimensional memory cell array. However, flash memory having three-dimensional memory cell arrays are also susceptible to the inventive concept.

Figure 17:
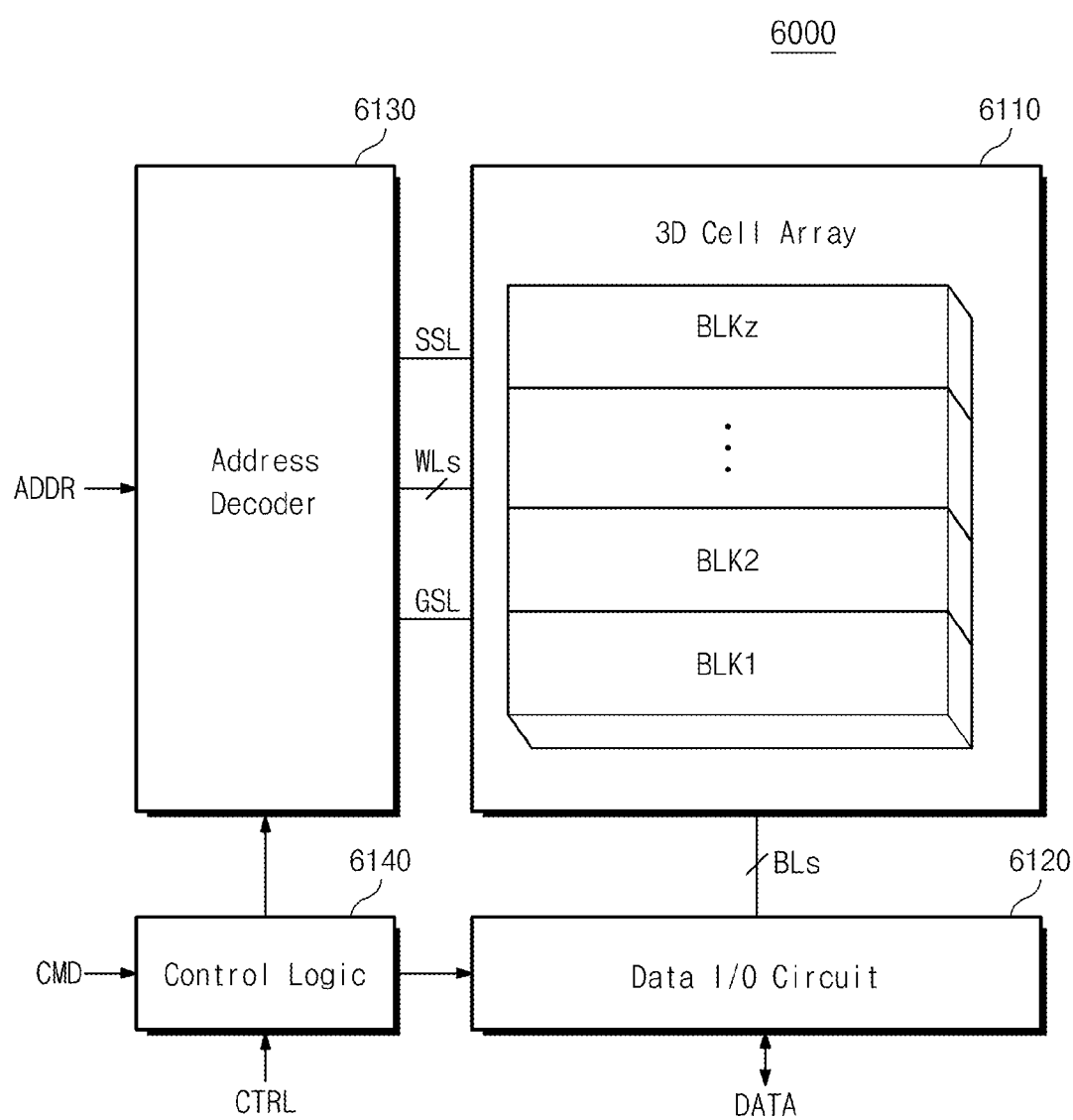
FIG. 17 is a block diagram illustrating a flash memory applied to the inventive concept.

FIG. 17 is a block diagram illustrating a flash memory applied to the inventive concept. Referring to FIG. 17, a flash memory 6000 may include a three-dimensional (3D) cell array 6110, a data input/output circuit 6120, an address decoder 6130, and control logic 6140.

The 3D cell array 6110 may include a plurality of memory blocks BLK1 to BLKz, each of which is formed to have a three-dimensional structure (or, a vertical structure). For a memory block having a two-dimensional (horizontal) structure, memory cells may be formed in a direction horizontal to a substrate. For a memory block having a three-dimensional structure, memory cells may be formed in a direction perpendicular to the substrate. Each memory block may be an erase unit of the flash memory 6000.

The data input/output circuit 6120 may be connected with the 3D cell array 6110 via a plurality of bit lines. The data input/output circuit 6120 may receive data from an external device or output data read from the 3D cell array 6110 to the external device. The address decoder 6130 may be connected with the 3D cell array 6110 via a plurality of word lines and selection lines GSL and SSL. The address decoder 6130 may select the word lines in response to an address ADDR.

The control logic 6140 may control programming, erasing, reading, etc. of the flash memory 6000. For example, at programming, the control logic 6140 may control the address decoder 6130 such that a program voltage is supplied to a selected word line, and may control the data input/output circuit 6120 such that data is programmed.

Figure 18:
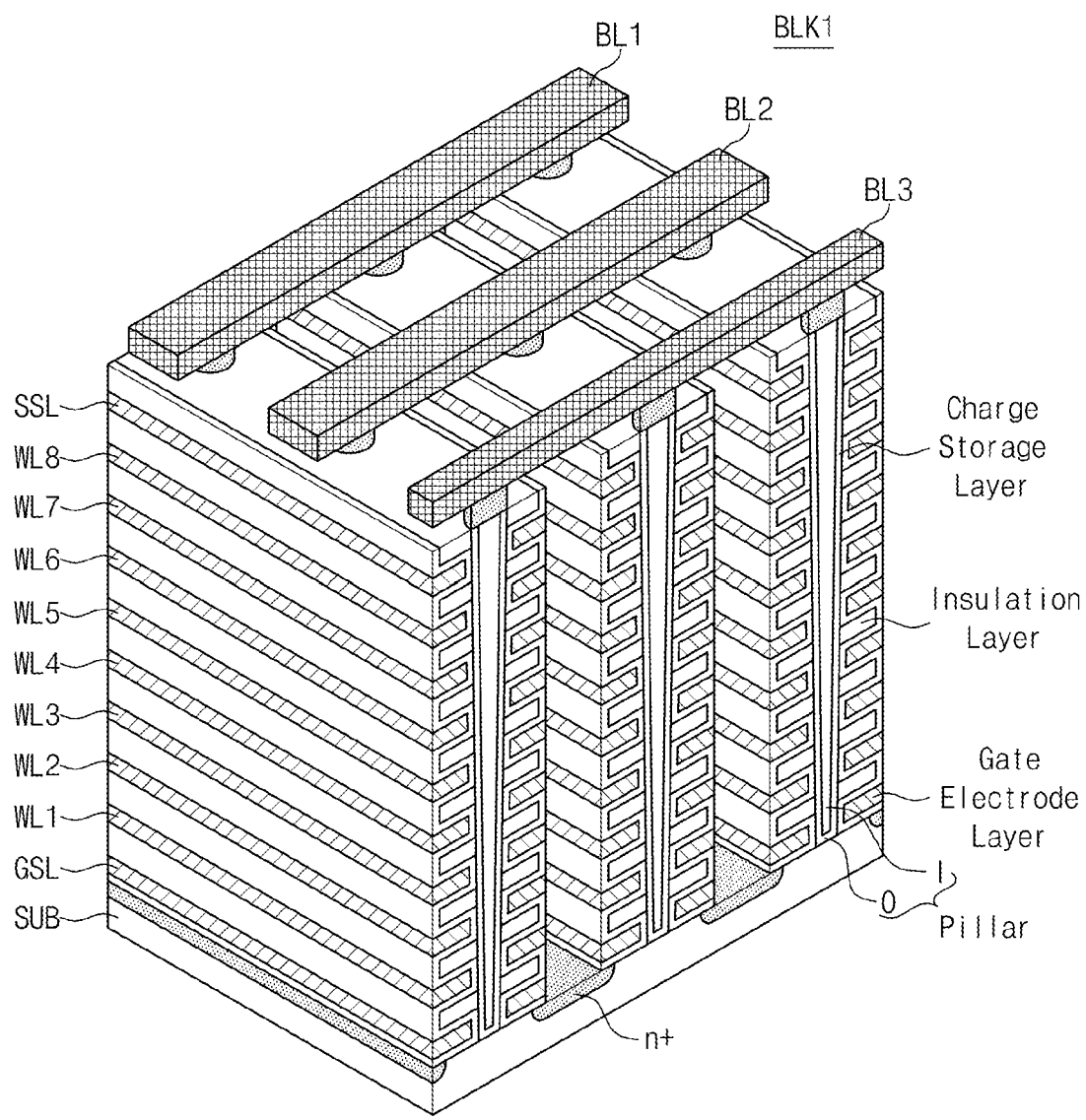
FIG. 18 is a perspective view schematically illustrating a 3D structure of a memory block illustrated in FIG. 17.

FIG. 18 is a perspective view illustrating a 3D structure of a memory block illustrated in FIG. 17. Referring to FIG. 18, a memory block BLK1 may be formed in a direction perpendicular to a substrate SUB. An n+ doping region may be formed at the substrate SUB. A gate electrode layer and an insulation layer may be deposited on the substrate SUB in turn. A charge storage layer may be formed between the gate electrode layer and the insulation layer.

If the gate electrode layer and the insulation layer are patterned in a vertical direction, a V-shaped pillar may be formed. The pillar may be connected with the substrate SUB via the gate electrode layer and the insulation layer. An outer portion O of the pillar may be formed of a channel semiconductor, and an inner portion thereof may be formed of an insulation material such as silicon oxide.

The gate electrode layer of the memory block BLK1 may be connected with a ground selection line GSL, a plurality of word lines WL1 to WL8, and a string selection line SSL. The pillar of the memory block BLK1 may be connected with a plurality of bit lines BL1 to BL3. In FIG. 18, there is exemplarily illustrated the case that one memory block BLK1 has two selection lines SSL and GSL and eight word lines WL1 to WL8. However, embodiments of the inventive concept are not limited thereto.

Figure 19:
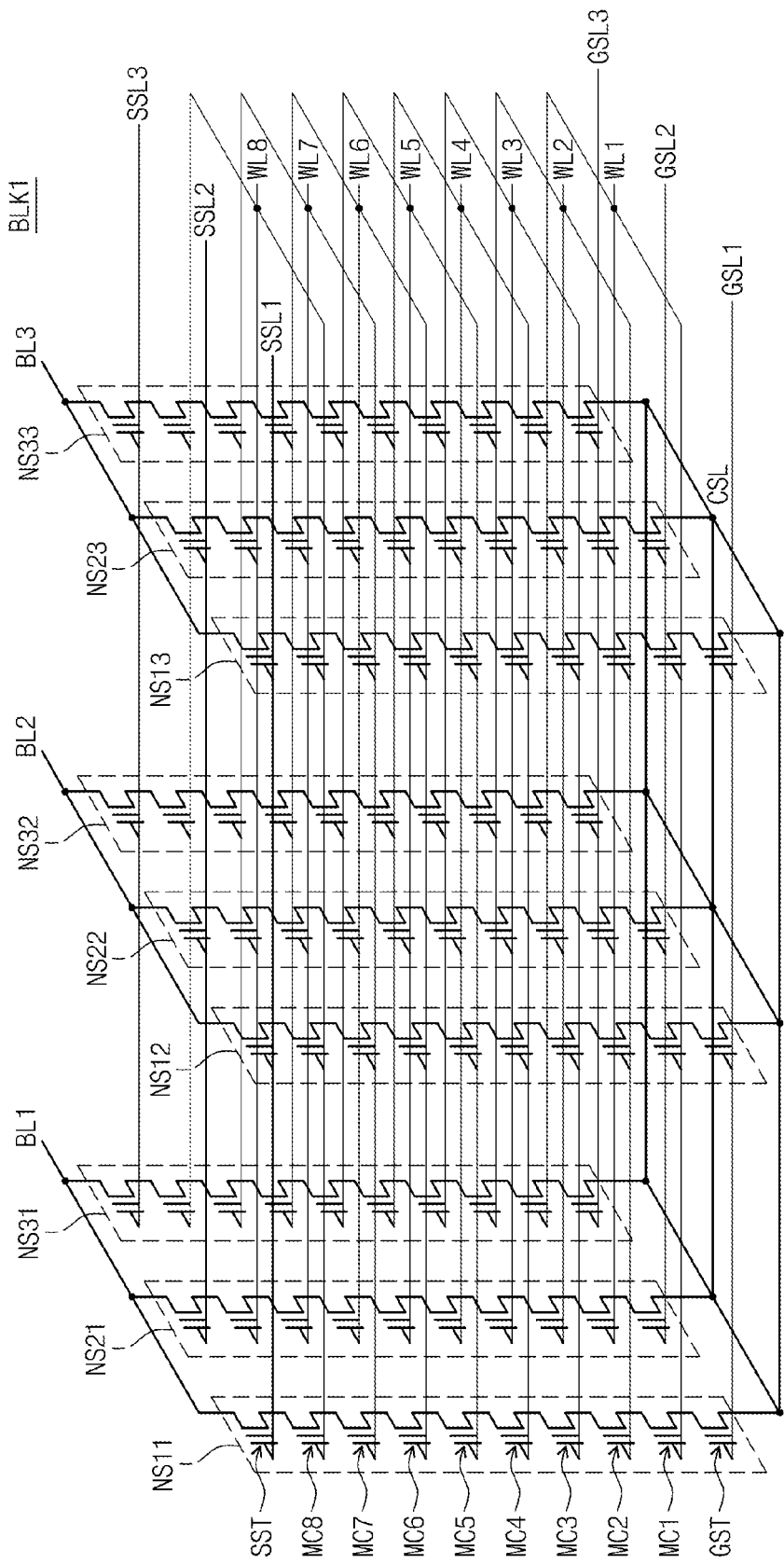
FIG. 19 is an equivalent circuit diagram for the memory block of FIG. 18.

FIG. 19 is an equivalent circuit diagram for the memory block illustrated in FIG. 18. Referring to FIG. 19, NAND strings NS11 to NS33 may be connected between bit lines BL1 to BL3 and a common source line CSL. Each NAND string (e.g., NS11) may include a string selection transistor SST, a plurality of memory cells MC1 to MC8, and a ground selection transistor GST.

The string selection transistors SST may be connected with string selection lines SSL1 to SSL3. The memory cells MC1 to MC8 may be connected with corresponding word lines WL1 to WL8, respectively. The ground selection transistors GST may be connected with ground selection lines GSL1 to GSL3. A string selection transistor SST may be connected with a bit line, and a ground selection transistor GST may be connected with a common source line CSL.

Word lines (e.g., WL1) having the same height may be connected in common, and the ground selection lines GSL1 to GSL3 and the string selection lines SSL1 to SSL3 may be separated from one another. At programming of memory cells (constituting a page) connected with a first word line WL1 and included in NAND strings NS11, NS12, and NS13, a first word line WL1, a first string selection line SSL1, and a first ground selection line may be selected.

According to embodiments of the inventive concept, it is possible to reduce necessary migration of file data between a cache region of a nonvolatile memory device and a main region thereof, as well as an erase count for the main region. Further, embodiments of the inventive concept may perform a migration operation efficiently although a space of an SLC region to be used is insufficient. This may be accomplished by assigning a part of an MLC region of the nonvolatile memory device to a cache region.

The above-disclosed subject matter is to be considered illustrative, and not restrictive, and the appended claims are intended to cover modifications and enhancements to the embodiments. Thus, to the maximum extent allowed by law, the scope is to be determined by the broadest permissible interpretation of the following claims and their equivalents, and shall not be restricted or limited by the foregoing detailed description.

What is claimed is:

1. A memory system comprising:
a nonvolatile memory including a main region and a cache region; and
a memory controller configured to control operation of the nonvolatile memory and including a migration manager that manages file data migration from the cache region to the main region with reference to a Most Recently Used (MRU)/Least Recently Used (LRU) list containing entries for file data units stored in the cache region, wherein the migration manager defines the MRU/LRU list as an arrangement of highest to lowest queue locations, such that entries related to more recently written file data units are arranged higher in queue location than entries related to more recently read file data units, and entries related to more recently read file data units are arranged higher in queue location than entries related to less recently written file data units and entries related to less recently read file data units.

2. The memory system of claim 1, wherein an entry for a most recently written file data unit is placed by the migration manager in the highest queue location of the MRU/LRU list.

3. The memory system of claim 1, wherein for each successive write operation, an entry for a corresponding file data unit written to the cache region is placed in the highest queue location of the MRU/LRU list by the migration manager, and existing entries to the MRU/LRU list are shifted down towards the lowest queue location by the migration manager.

4. The memory system of claim 3, wherein for each read operation directed to a file data unit stored in the cache region, an entry for a corresponding file data read unit is shifted up towards the highest queue location of the MRU/LRU list by the migration manager but no higher in the MRU/LRU list than entries for the more recently written file data units.

5. The memory system of claim 4, wherein the main region comprises multi-level memory cells (MLC), and the cache region comprises single-level memory cells (SLC).

6. The memory system of claim 1, wherein the nonvolatile memory stores input data received from an external device during a write operation in the cache region, and subsequently moves the input data from the cache region to the main region by operation of the migration manager with reference to the MRU/LRU list.

7. The memory system of claim 6, wherein the migration manager starts execution of the migration operation when an amount of used space in the cache region exceeds a first threshold, and the migration manager stops the migration operation when the amount of used space in the cache region falls below a second threshold.

8. The memory system of claim 6, wherein the migration manager starts execution of the migration operation when an amount of available space in the cache region falls below a first threshold, and the migration manager stops the migration operation when the amount of available space in the cache region exceeds a second threshold.

9. The memory system of claim 1, wherein the nonvolatile memory is a flash memory.

10. The memory system of claim 1, wherein the cache region and the main region are implemented on a single memory chip.

11. The memory system of claim 1, wherein the cache region and the main region are respectively implemented on separate memory chips.

12. A memory system comprising:
a flash memory having a main region configured from multi-level memory cells (MLC) and a cache region configured from single-level memory cells (SLC); and
a memory controller configured to control operation of the flash memory and including a migration manager that manages file data migration from the cache region to the main region with reference to a Most Recently Used (MRU)/Least Recently Used (LRU) list containing entries for file data units stored in the cache region, wherein the memory controller temporarily uses some of the MLC as part of the cache region if an insufficient number of the SLC are available when a file data unit is stored in the cache region.

13. The memory system of claim 12, wherein the migration manager defines the MRU/LRU list as an arrangement of highest to lowest queue locations, such that entries related to more recently written file data units are arranged higher in queue location than entries related to more less recently read file data units, and entries related to more recently read file data units are arranged higher in queue location than entries related to less recently written file data units and entries related to less recently read file data units.

14. The memory system of claim 13, wherein an entry for a most recently written file data unit is placed by the migration manager in the highest queue location of the MRU/LRU list.

15. The memory system of claim 14, wherein for each successive write operation, an entry for a corresponding file data unit written to the cache region is placed in the highest queue location of the MRU/LRU list by the migration manager, and existing entries to the MRU/LRU list are shifted down towards the lowest queue location by the migration manager.

16. The memory system of claim 15, wherein for each read operation directed to a file data unit stored in the cache region, an entry for a corresponding file data read unit is shifted up towards the highest queue location of the MRU/LRU list by the migration manager but no higher in the MRU/LRU list than entries for the more recently written file data units.

17. The memory system of claim 12, wherein the memory controller stores input data received from an external device in the SLC region during a write operation and subsequently moves the stored input data from the SLC region to the MLC region in accordance with the MRU/LRU list.

18. The memory system of claim 12, wherein the migration manager starts execution of the migration operation when an amount of used space in the cache region exceeds a first threshold, and stops the migration operation when the amount of used space in the cache region falls below a second threshold.

19. The memory system of claim 12, wherein the SLC and MLC are commonly implemented on a single memory chip.

20. The memory system of claim 12, wherein the SLC and MLC are respectively implemented on different memory chips.

21. The memory system of claim 1, wherein the nonvolatile memory includes a plurality of cell strings connected to a bit line, each cell string including a plurality of memory cells connected to one another in series, each memory cell being connected to each of a plurality of word lines, respectively.

22. The memory system of claim 12, wherein the flash memory includes a plurality of cell strings connected to a bit line, each cell string including a plurality of memory cells connected to one another in series, each memory cell being connected to each of a plurality of word lines, respectively.

* * * * *